United States Patent
Tange et al.

(10) Patent No.: US 7,001,470 B2
(45) Date of Patent: Feb. 21, 2006

(54) CLEANING PROCESS FOR PHOTOMASKS

(75) Inventors: Koji Tange, Tokyo (JP); Yoshikazu Nagamura, Tokyo (JP); Kunihiro Hosono, Tokyo (JP); Yasutaka Kikuchi, Tokyo (JP); Yuki Oomasa, Tokyo (JP); Koichi Kido, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 257 days.

(21) Appl. No.: 10/119,009

(22) Filed: Apr. 10, 2002

(65) Prior Publication Data

US 2002/0155360 A1    Oct. 24, 2002

(30) Foreign Application Priority Data

Apr. 18, 2001    (JP) ............................. 2001-119950

(51) Int. Cl.
*C25G 1/02*    (2006.01)

(52) U.S. Cl. ..................... 134/3; 134/25.4; 134/31; 134/42

(58) Field of Classification Search ............. 134/1, 134/1.3, 2, 3, 6, 25.1, 25.4, 26, 28, 29, 31, 134/37, 42; 216/57, 83, 94
See application file for complete search history.

(56) References Cited

U.S. PATENT DOCUMENTS

| | | | |
|---|---|---|---|
| 4,873,163 A * | 10/1989 | Watakabe et al. ............... 430/5 |
| 5,290,647 A * | 3/1994 | Miyazaki et al. ............... 430/5 |
| 5,372,651 A * | 12/1994 | Kodama ....................... 134/26 |
| 5,723,238 A | 3/1998 | Moore et al. |
| 6,027,837 A | 2/2000 | Adair et al. |
| 6,039,815 A * | 3/2000 | Yeol et al. ....................... 134/2 |
| 6,209,553 B1 | 4/2001 | Nagamura et al. |
| 6,240,933 B1 * | 6/2001 | Bergman ..................... 134/1.3 |
| 6,423,146 B1 * | 7/2002 | Fukazawa ....................... 134/2 |
| 6,681,781 B1 * | 1/2004 | Puri et al. .................... 134/1.3 |
| 2001/0001392 A1 | 5/2001 | Hirae et al. |

FOREIGN PATENT DOCUMENTS

| | | |
|---|---|---|
| DE | 198 44 443 A1 | 6/1999 |
| JP | 59-24849 | 2/1984 |
| JP | 2-966 * | 1/1990 |
| JP | 10-62965 | 3/1998 |
| JP | 11-29795 | 2/1999 |
| JP | 11-297657 | 10/1999 |
| JP | 2000-12500 | 1/2000 |
| JP | 2000-98320 | 4/2000 |
| JP | 2000-164552 | 6/2000 |
| WO | WO 01/07177 A1 | 2/2001 |
| WO | WO 01/26144 A1 | 4/2001 |

OTHER PUBLICATIONS

W. Kern. Handbook of Semiconductor wafer Cleaning Technology. Noyes Publications. 1993, pp141-142.*

* cited by examiner

*Primary Examiner*—M. Kornakov
(74) *Attorney, Agent, or Firm*—McDermott Will & Emery LLP

(57) ABSTRACT

A photomask provided with a light-shielding coating on a surface of a glass substrate is cleaned with $O_3$ gas solved water to eliminate organic substances adhered on a surface of the photomask (S120). Using an alkaline chemical such as alkaline ionized water or hydrogenated water, the photomask is then cleaned to eliminate contamination (S122). After completion of these cleaning steps, the photomask is dried (S124).

3 Claims, 3 Drawing Sheets

CLEANING PROCESS FOR PHOTOMASKS

BACKGROUND OF THE INVENTION

1. Field of the Invention

The present invention relates to a cleaning process for photomasks, and especially to a cleaning process suitable for use upon cleaning photomasks with light-shielding coatings provided on surfaces of glass substrates.

2. Description of the Background Art

Photomasks with light-shielding coatings of a Cr or MoSi material provided on surfaces of glass substrates have been known for years. FIG. 4 is a flow chart of one example of a first conventional process for cleaning a photomask having the above-described construction.

As is illustrated in FIG. 4, according to the conventional process for cleaning the photomask, a cleaning step making use of sulfuric acid or sulfuric acid-hydrogen peroxide mixture is firstly conducted to eliminate organic substances adhered on a surface of the photomask (S100). The degree of contamination of a photomask with organic substances can be determined based on the wettability of the photomask with water or the like dropped onto its surface. Described specifically, the wettability of a photomask with water or the like dropped onto the photomask becomes better as the degree of contamination of the photomask with organic substances becomes lower. The objective of the cleaning step S100 can, therefore, be rephrased to improve the wettability of the photomask.

For rinsing off sulfuric acid or sulfuric acid-hydrogen peroxide mixture remaining on the photomask, a rinsing step is then conducted with pure water (S102). To increase the cleanliness of the photomask, it is necessary to perform thorough rinsing in this step.

To eliminate contamination adhering on the photomask, a cleaning step is then conducted using ammonia or hydrogen peroxide (S104). In this step, pure water or a cleaning solution prepared by adding a detergent to pure water may be used instead of ammonia or hydrogen peroxide.

As in the cleaning with sulfuric acid or sulfuric acid-hydrogen peroxide mixture, after the above-described step S104, a rinsing step making use of pure water is also conducted (S106). To sufficiently increase the cleanliness of the photomask, it is also necessary to perform thorough rinsing in this stage.

After the photomask is fully rinsed in the above-described step S106, a drying step is then conducted to dry the photomask (S108).

FIG. 5 is a flow chart of a second conventional process for cleaning a photomask having a Cr or MoSi light-shielding coating. According to the second conventional process, a cleaning step is firstly performed with a view to eliminating organic substances or improving wettability as in the first conventional process. Described specifically, a cleaning step is performed using sulfuric acid or sulfuric acid-hydrogen peroxide mixture as a cleaning solution (S110).

In the second conventional process, a cleaning step making use of an alkaline chemical such as aqueous ammonia or hydrogenated water is then performed to eliminate sulfuric acid or contamination still remaining on the photomask (S112).

Subsequent to the above-mentioned two steps, a drying step is performed to dry the photomask (S114).

According to the conventional cleaning processes, a photomask provided with a Cr or MoSi light-shielding coating is firstly cleaned with sulfuric acid or sulfuric acid-hydrogen peroxide mixture as mentioned above. In the first conventional process (FIG. 4), for example, insufficient performance of the rinsing step S102 may, therefore, leads to sulfate ions remaining on the surface of the photomask, thereby developing a potential problem that a blur tends to occur on the surface of the photomask. According to the first conventional process, a need has hence arisen to use a great deal of pure water of high temperature in the above-described step S102 to avoid such a problem.

Especially when a halftone photomask having an MoSi light-shielding coating is to be cleaned, the first and second conventional processes develop another problem as will be described next. In a halftone photomask, optical characteristics (transmittance and phase angle) of a light-shielding coating have high importance. Upon cleaning halftone masks, it is thus important to keep their optical characteristics unchanged. Keeping in step with the move toward mask patterns of increasingly shrunk sizes in recent years, however, variations in the optical characteristics of halftone masks, said variations arising as a result of cleaning with sulfuric acid or sulfuric acid-hydrogen peroxide mixture (S100 or S110), are becoming no longer ignorable.

SUMMARY OF THE INVENTION

The present invention has been completed with a view to resolving such problems as described above. An object of the present invention is, therefore, to provide a cleaning process for a photomask, which can readily avoid blurring of the photomask and gives no substantial influence to the optical characteristics of the photomask even when the photomask is a halftone photomask.

The above objects of the present invention are achieved by a cleaning process for a photomask provided with a light-shielding coating on a surface of a glass substrate, which comprises the following steps of cleaning said photomask with $O_3$ gas solved water; eliminating contamination adhered on a surface of said photomask; and drying said photomask.

Other objects and further features of the present invention will be apparent from the following detailed description when read in conjunction with the accompanying drawings.

DESCRIPTION OF THE PREFERRED EMBODIMENTS

Figure 1:
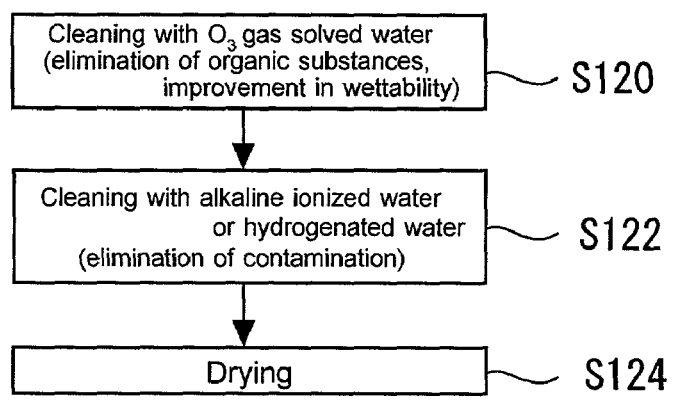
FIG. 1 is a flow chart showing steps of a photomask cleaning process according to a first embodiment of the present invention.

With reference to the accompanying drawings, a description will hereinafter be made about an embodiment of the present invention. Elements common to the drawings are identified by like reference numerals, and their overlapping description is omitted herein.

Referring first to the flow chart of FIG. 1, the photomask cleaning process according to this embodiment of the present invention will be described. The cleaning process according to this embodiment is to clean a photomask provided on a surface of a glass substrate with Cr or MoSi light-shielding coating.

As is illustrated in FIG. 1, according to the cleaning process of this embodiment, a first step is performed to clean the photomask with $O_3$ gas solved water (S120). This cleaning step is conducted to eliminate organic substances adhered on the surface of the photomask, that is, to improve the wettability of the surface of the photomask.

Using an alkaline chemical, more specifically, hydrogenated water, hydrogenated water with a small amount of aqueous ammonia added therein, alkaline ionized water or the like, another step is then performed to clean the photomask (S122) This cleaning step is conducted to eliminate contamination adhered on the surface of the photomask.

Finally, a further step is performed to dry the photomask cleaned by the above-described processing in S120 and S122 (S124). By performing these steps, the surface of the photomask having the Cr or MoSi light-shielding coating can be washed clean.

In the above-mentioned process of the embodiment, the cleaning of the photomask in S120 was conducted using $O_3$ gas solved water. It is, however, to be noted that in the present invention, the cleaning solution for use in this step is not limited to $O_3$ gas solved water. Described specifically, the cleaning of the photomask in S120 may be conducted by using, instead of $O_3$ gas solved water, $O_3$ gas solved water prepared to be acidic by dissolution of carbon dioxide gas or $O_3$ gas solved water prepared to be acidic by addition of a small amount of sulfuric acid.

In the above-mentioned process of the embodiment, the cleaning of the photomask was conducted using $O_3$ gas solved water of room temperature. It is, however, to be noted that in the present invention, the temperature of the cleaning solution is not limited to room temperature. Described specifically, $O_3$ gas solved water or acidic $O_3$ gas solved water usable in place of the $O_3$ gas solved water may be heated to a temperature higher than room temperature but not higher than about 80° C., more preferably to about 40° C.

Figure 2:
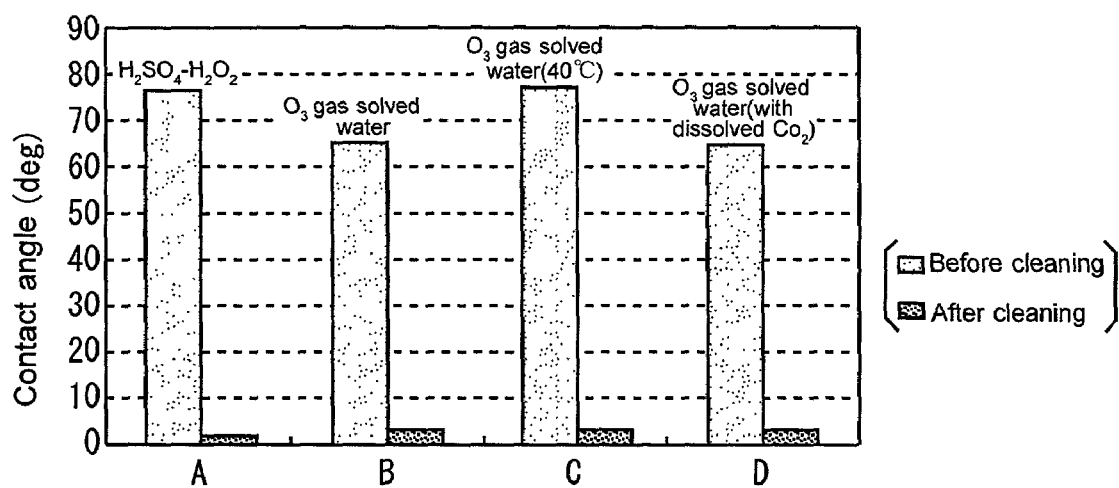
FIG. 2 is a graphic representation of measurement results, which shows relationships between contact angles of droplets of pure water dropped on photomasks and cleaning processes.
Figure 3:
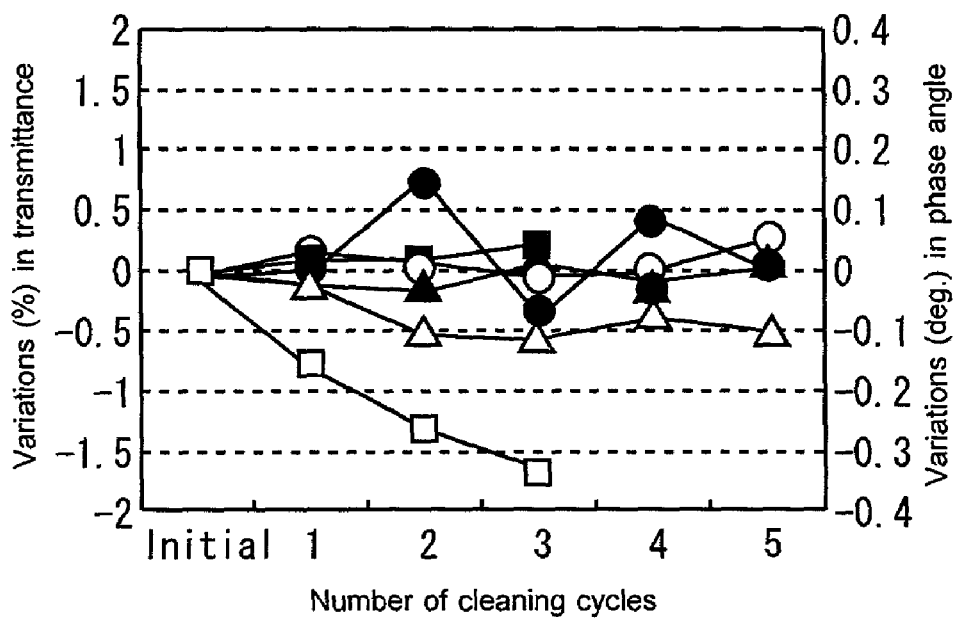
FIG. 3 is a graphic representation of measurement results, which illustrates relationships between optical characteristics of halftone photomasks having MoSi light-shielding coatings and cleaning processes.

Referring next to FIG. 2 and FIG. 3, a description will be made about advantageous effects available from the cleaning process of this embodiment.

FIG. 2 illustrates the cleanliness levels of photomasks before and after they were cleaned by plural cleaning processes including the cleaning process of this embodiment, respectively, in comparison with each other. In FIG. 2, contact angles of pure water droplets dropped onto surfaces of photomasks are plotted along the ordinate. As the degree of contamination of a photomask with organic substances becomes lower, the photomask shows better wettability with pure water dropped onto the photomask. Accordingly, the contact angle of the photomask takes a smaller value as the degree of contamination of the photomask with the organic substances becomes lower.

A description will hereinafter be made of the procedures of an experiment which was conducted to obtain the results shown in FIG. 2. In the experiment, specimens were firstly prepared by evenly coating HMDS (hexamethyldisilazane) on clean photomasks having light-shielding coatings of Cr, namely, on their Cr layers. HMDS is an evaluating chemical for applying standard organic contamination to photomask surfaces.

Onto the individual specimens, pure water was dropped before subjecting them to a cleaning step. The contact angles of the pure water dropped on the specimens were measured as contact angles before cleaning. Subsequent to the measurement of the contact angles before cleaning, the individual specimens were cleaned by the predetermined cleaning processes, respectively. After the cleaning, pure water was dropped again onto the specimens to measure contact angles after the cleaning.

In FIG. 2, the two results identified by sign A indicate the contact angles before and after one of the above-mentioned specimens (photomasks with standard contamination) was cleaned with sulfuric acid-hydrogen peroxide mixture. The two results identified by sign B show the contact angles before and after another one of the above-mentioned specimens was cleaned with $O_3$ gas solved water. The two results identified by sign C indicate the contact angles before and after further one of the above-mentioned specimens was cleaned with hot $O_3$ gas solved water heated to 40° C. The two results identified by sign D show the contact angles before and after further one of the above-mentioned specimens was cleaned with $O_3$ gas solved water prepared to be acidic.

The $O_3$ gas solved water corresponding to sign D was $O_3$ gas solved water with carbon dioxide gas bubbled and dissolved therein such that the pH of the $O_3$ gas solved water fell within a range of from 4 to 5. Although not shown in FIG. 2, use of $O_3$ gas solved water the pH of which has been adjusted to 4 to 5 by adding a small amount of sulfuric acid as a cleaning solution can also bring about similar results as the results indicated by sign D.

As is evident from the results shown in FIG. 2, use of $O_3$ gas solved water for cleaning can obtain a contact angle equivalent to that available from cleaning with sulfuric acid-hydrogen peroxide mixture. More specifically, cleaning with $O_3$ gas solved water can improve the wettability of a photomask to a similar extent as that achievable from the use of a sulfuric acid-hydrogen peroxide as a cleaning solution, that is, can eliminate organic substances on the photomask.

It is also appreciated that the cleaning ability of $O_3$ gas solved water is also retained at substantially the same level even when the $O_3$ gas solved water is heated to a temperature higher than room temperature but not higher than about 80°

C. or when the $O_3$ gas solved water is prepared to be weakly acidic. The excellent cleaning ability of these $O_3$ gas solved waters is also exhibited likewise when cleaning is applied to halftone masks having MoSi light-shielding coatings.

Figure 4:
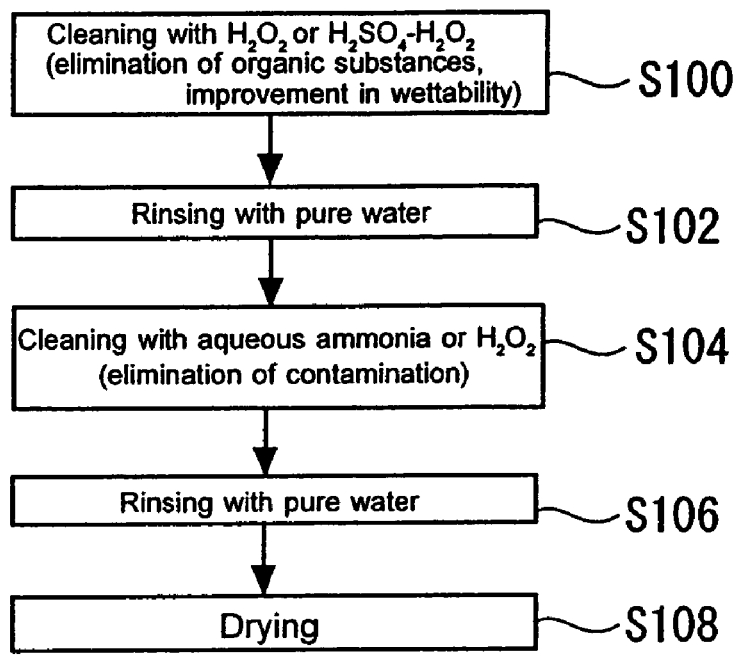
FIG. 4 is a flow chart of a first conventional process for cleaning a photomask.
Figure 5:
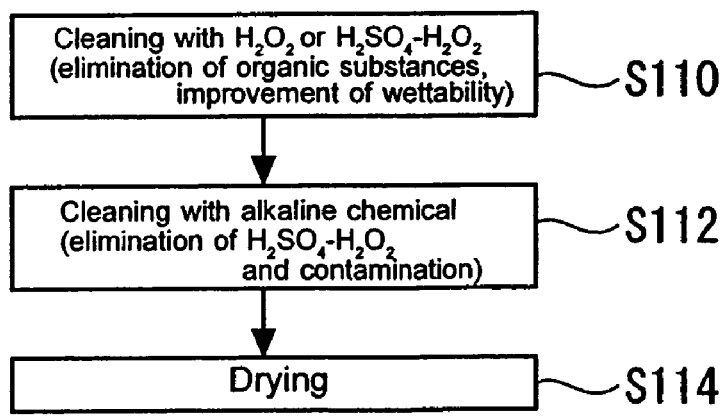
FIG. 5 is a flow chart of a second conventional process for cleaning a photomask.

As is readily envisaged from the foregoing, the cleaning solutions usable in the cleaning process of this embodiment, namely, $O_3$ gas solved water, acidic $O_3$ gas solved water and heated $O_3$ gas solved water are all equipped with sufficient organic-substance eliminating ability, in other words, sufficient wettability improving ability as cleaning solutions for photomasks having Cr or MoSi light-shielding coatings. Without using sulfuric acid or sulfuric acid-hydrogen peroxide mixture, use of the cleaning process of this embodiment can hence assure a similar level of cleanliness as that available from the use of sulfuric acid or sulfuric acid-hydrogen peroxide mixture. This means that the cleaning process of this embodiment makes it possible to reduce the amount of a chemical such as sulfuric acid or sulfuric acid-hydrogen peroxide mixture to be used, to prevent sulfate ions from remaining on the surfaces of photomasks, and further to significantly save a rinsing solution (pure water) which is used in large amounts in the conventional cleaning processes (see FIG. 4).

FIG. 3 shows variations in optical characteristics of MoSi light-shielding coatings of halftone masks, in comparison with each other, when the half tone masks were cleaned by plural cleaning processes including the cleaning process of this embodiment, respectively. In FIG. 3, variations (%) in the transmittance of each MoSi light-shielding coating are plotted along the ordinate (on the left-hand side in the figure), and variations (deg.) in the phase angle of each MoSi light-shielding coating are plotted along the ordinate (on the right-hand side in the figure). On the other hand, the abscissa in FIG. 3 represents the number of cleaning cycles.

A description will hereinafter be made of the procedures of an experiment which was conducted to obtain the results shown in FIG. 3. In the experiment, the halftone masks having the MoSi light-shielding coatings were firstly provided as specimens. Those specimens were repeatedly cleaned with sulfuric acid-hydrogen peroxide mixture, $O_3$ gas solved water and $O_3$ gas solved water prepared to be acidic (i.e., $O_3$ gas solved water the pH of which had been adjusted to 4 to 5 by bubbling of carbon dioxide gas), respectively. Variations in transmittance and phase angle, which occurred on each MoSi light-shielding coating after each cleaning operation, were measured.

In FIG. 3, the results indicated by squares □ show variations in transmittance occurred on the light-shielding coating when cleaning was conducted with sulfuric acid-hydrogen peroxide mixture. As is indicated by the results, the transmittance of an MoSi light-shielding coating varies rather significantly when sulfuric acid-hydrogen peroxide mixture is used as a cleaning solution.

In FIG. 3, the results indicated by triangles a and the results indicated by triangular dots ▲ show variations in transmittance and phase angle, respectively, which occurred on the light-shielding coating when cleaning was conducted with $O_3$ gas solved water. As is indicated by the results, the transmittance of an MoSi light-shielding coating remains substantially unvaried even by repeated cleaning insofar as $O_3$ gas solved water is used as a cleaning solution.

In FIG. 3, the results indicated by circles ○ and the results indicated by circular dots ● show variations in transmittance and phase angle, respectively, which occurred on the light-shielding coating when cleaning was conducted using $O_3$ gas solved water which had been prepared to be acidic. As is indicated by the results, the transmittance of an MoSi light-shielding coating does not vary significantly by repeated cleaning even when acidic $O_3$ gas solved water is used.

The $O_3$ gas solved water corresponding to the results indicated by the circles ○ or circular dots ● was $O_3$ gas solved water with carbon dioxide gas bubbled and dissolved therein such that the pH of the $O_3$ gas solved water fell within a range of from 4 to 5. Although not shown in FIG. 3, use of $O_3$ gas solved water the pH of which has been adjusted to 4 to 5 by adding a small amount of sulfuric acid as a cleaning solution can also bring about similar results as the results indicated by sign D. Although not shown in FIG. 3 either, use of even $O_3$ gas solved water—which has been heated to a temperature higher than room temperature but not higher than about 80° C.—as a cleaning solution does not develop substantial variations in the optical characteristics (transmittance, phase angle) of an MoSi light-shielding coating.

As is readily appreciated from the foregoing, the cleaning solutions usable in the cleaning process of this invention, specifically, $O_3$ gas solved water, acidic $O_3$ gas solved water and heated $O_3$ gas solved water are superior to sulfuric acid solutions in stably maintaining the optical characteristics of MoSi light-shielding coatings. As a consequence, the cleaning process of this embodiment makes it possible to cleanly wash halftone photomasks without developing variations in the optical characteristics of the halftone photomasks although such variations have remained as unsolved problems in the conventional cleaning processes.

In the above-described embodiment, carbon dioxide gas was bubbled and dissolved in $O_3$ gas solved water to acidify it. It is, however, to be noted that the gas to be dissolved in $O_3$ gas solved water to acidify it is not limited to carbon dioxide gas. Other gas may be used as the gas to be dissolved in $O_3$ gas solved water insofar as it can acidify the same.

In the above-described embodiment, $O_3$ gas solved water was acidified by adding a small amount of sulfuric acid. It is, however, to be noted that the method for acidifying $O_3$ gas solved water is not limited to the addition of sulfuric acid. For example, $O_3$ gas solved water may be prepared to be acidic by adding an acidic electrolyte such as hydrochloric acid in lieu of sulfuric acid.

In the above-described embodiment, no specific reference was made as to how the cleaning steps S120, S122 were conducted. These cleaning steps can be achieved by soaking photomasks in overflow tanks with corresponding cleaning solutions such as $O_3$ gas solved water and an alkaline chemical filled therein. Still higher cleaning effects can be obtained provided that ultrasonic waves are applied to the photomasks through the cleaning solutions inside the overflow tanks.

The major benefits of the present invention described above are summarized as follows:

According to a first aspect of the present invention, organic substances deposited on the light-shielding coating of the photomask can be eliminated without using sulfuric acid or a like chemical. Therefore, the cleaning process can surely prevent sulfate ions from remaining on the surface of the photomask and moreover, can reduce the amount of pure water to be used for rinsing the photomask.

According to a second aspect of the present invention, it is possible to eliminate organic substances adhered on the halftone photomask, which has the MoSi light-shielding coating, without changing optical characteristics of the halftone mask.

According to a third aspect of the present invention, the photomask can be washed clean by using the $O_3$ gas solved water which has been prepared to be acidic.

According to a fourth aspect of the present invention, ultrasonic cleaning is combined with at least one of the cleaning step making use of the $O_3$ gas solved water (the first step) and the cleaning step intended for the elimination of contamination (the second step). Therefore, high cleaning effects can be obtained.

Further, the present invention is not limited to these embodiments, but variations and modifications may be made without departing from the scope of the present invention.

The entire disclosure of Japanese Patent Application No. 2001-119950 filed on Apr. 18, 2001 including specification, claims, drawings and summary are incorporated herein by reference in its entirety.

What is claimed is:

1. A cleaning process for a photomask provided with a light-shielding coating on a surface of a glass substrate, which comprises the following steps of:

providing a halftone photomask having a MoSi light-shielding coating;

cleaning said photomask with $O_3$ gas solved water, wherein said $O_3$ gas solved water has been prepared to be acidic;

eliminating contamination adhered on a surface of said photomask; and drying said photomask.

2. A cleaning process according to claim 1, wherein said $O_3$ gas solved water has been prepared to be acidic by addition of an acidic electrolyte.

3. A cleaning process according to claim 1, wherein said $O_3$ gas solved water has been prepared to be acidic by dissolving acidic gas.

* * * * *